(12) United States Patent
Mizuno (10) Patent No.: US 9,595,655 B2
(45) Date of Patent: Mar. 14, 2017

(54) SEMICONDUCTOR DEVICE AND METHOD OF MANUFACTURING THE SAME

(75) Inventor: Yoshihito Mizuno, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/238,159

(22) PCT Filed: Sep. 7, 2011

(86) PCT No.: PCT/JP2011/070384
§ 371 (c)(1),
(2), (4) Date: Feb. 10, 2014

(87) PCT Pub. No.: WO2013/035173
PCT Pub. Date: Mar. 14, 2013

(65) Prior Publication Data
US 2014/0197514 A1    Jul. 17, 2014

(51) Int. Cl.
| | | |
|---|---|---|
| H01L 31/058 | (2006.01) |
| H01L 35/34 | (2006.01) |
| G01K 7/02 | (2006.01) |
| H01L 35/20 | (2006.01) |
| H01L 35/32 | (2006.01) |
| H01L 35/28 | (2006.01) |
| G01K 7/01 | (2006.01) |

(52) U.S. Cl.
CPC .............. *H01L 35/34* (2013.01); *G01K 7/01* (2013.01); *G01K 7/02* (2013.01); *H01L 35/20* (2013.01); *H01L 35/28* (2013.01); *H01L 35/32* (2013.01)

(58) Field of Classification Search
CPC .......... H01L 35/20; H01L 35/28; H01L 35/34
USPC .......................................... 257/114, 458, 470
See application file for complete search history.

(56) References Cited

U.S. PATENT DOCUMENTS

| | | | |
|---|---|---|---|
| 3,956,820 A * | 5/1976 | Swartz et al. ................. 438/411 |
| 4,966,676 A | 10/1990 | Fukasawa et al. |
| 5,245,510 A | 9/1993 | Honda |
| 5,569,950 A | 10/1996 | Lewis et al. |
| 6,597,182 B1 * | 7/2003 | Tachibana ............... C25D 21/12 |
| | | | 324/537 |
| 2003/0057512 A1 | 3/2003 | Sterzel et al. |
| 2005/0162047 A1 * | 7/2005 | Torii ........................ B41J 2/161 |
| | | | 310/358 |
| 2006/0187272 A1 * | 8/2006 | Torii et al. ....................... 347/68 |
| 2008/0237872 A1 * | 10/2008 | Nagayama ..................... 257/773 |

FOREIGN PATENT DOCUMENTS

| | | |
|---|---|---|
| JP | A-05-326824 | 12/1993 |
| JP | A-06-1044994 | 4/1994 |
| JP | A-07-041947 | 2/1995 |
| JP | A-08-070068 | 3/1996 |

(Continued)

*Primary Examiner* — Tan N Tran
(74) *Attorney, Agent, or Firm* — Oliff PLC (57) ABSTRACT

A semiconductor device that is equipped with a semiconductor substrate, a composite metal film, and a detection terminal is provided. The composite metal film is formed on a surface or a back face of the semiconductor substrate, and has a first metal film, and a second metal film that is joined to the first metal film and is different in Seebeck coefficient from the first metal film. The detection terminal can detect a potential difference between the first metal film and the second metal film.

15 Claims, 3 Drawing Sheets

(56) References Cited

FOREIGN PATENT DOCUMENTS

| | | |
|---|---|---|
| JP | A-10-041510 | 2/1998 |
| JP | A-2001-326221 | 11/2001 |
| JP | A-2003-092272 | 3/2003 |
| JP | A-2004-040068 | 2/2004 |
| JP | A-2005-221238 | 8/2005 |
| KR | 10-1989-0017383 A | 12/1989 |

\* cited by examiner

SEMICONDUCTOR DEVICE AND METHOD OF MANUFACTURING THE SAME

TECHNICAL FIELD

The art described in the present specification relates to a semiconductor device and a method of manufacturing the same.

BACKGROUND ART

In Japanese Patent Application Publication No. 10-41510 (JP-10-41510 A) (Patent Document 1), there is disclosed a semiconductor device that employs, as a temperature detection element, a PN diode that is arranged on a surface of a semiconductor substrate. A temperature of a surface of a semiconductor element is detected with the aid of a temperature dependency of a forward voltage of the PN diode that is arranged on the surface of the semiconductor substrate.

RELATED ART DOCUMENT

Patent Document

Patent Document 1: Japanese Patent Application Publication No. 10-41510 (JP-10-41510 A)

SUMMARY OF THE INVENTION

Problem to be Solved by the Invention

In the conventional temperature detection element that employs the PN diode, since the temperature is detected with the aid of the temperature dependency of the forward voltage at the time when a constant current is caused to flow through the temperature detection element, a change in voltage with respect to the forward voltage needs to be measured. For example, in the case where the forward voltage is 1.5 V and the rate of rise in voltage of the PN diode per temperature is 3 mV/° C., a change in voltage of about several mV needs to be detected through the use of a potential detector (e.g., a voltmeter) whose measurement range is set to several V, so that the forward voltage can be measured. It is difficult to accurately detect a minor change in voltage, and therefore, it is difficult to accurately detect a temperature.

Means for Solving the Problem

It has conventionally been normal to utilize one metal as a main electrode of a semiconductor device (an electrode that is formed in an element formation field of a semiconductor substrate, such as an emitter electrode or the like). In recent years, however, as the development of power semiconductor devices progresses, the necessity to promote the release of heat from the semiconductor devices has increased, and there have been developed technologies that employ a laminate electrode in which different metal films are laminated on each other as a main electrode to thereby improve the performance of heat release. The inventor took a hint from this laminate electrode, and has succeeded in inventing the concept of joining different metal films to each other and utilizing them as a temperature detection element of a semiconductor device.

The present specification discloses a semiconductor device that is equipped with: a semiconductor substrate; a composite metal film that is formed on a surface or a back face of the semiconductor substrate, and has a first metal film and a second metal film that is joined to the first metal film and is different in Seebeck coefficient from the first metal film; and a detection terminal that can detect a potential difference between the first metal film and the second metal film.

According to the aforementioned semiconductor device, a thermoelectromotive force of the first metal film and the second metal film can be measured by the detection terminal, and a temperature of the semiconductor device can thereby be detected. A temperature detection element that employs the composite metal film obtained by joining the first metal film and the second metal film to each other measures a thermoelectromotive force that is generated in accordance with a temperature difference between a temperature measurement contact point and a reference contact point, thereby detecting a temperature of the semiconductor device. Thus, the measurement can be carried out using a potential detector of a measurement range corresponding to the magnitude of the generated thermoelectromotive force. The temperature detection sensitivity can be enhanced in comparison with the conventional temperature detection element that employs the PN diode.

The detection terminal may be equipped with a first detection terminal that is electrically connected to the first metal film, and a second detection terminal that is electrically connected to the second metal film. In this case, the first detection terminal may be formed of the same material as the first metal film, and the second detection terminal may be formed of the same material as the second metal film.

The first metal film may be in contact with the surface or the back face of the semiconductor substrate, and the second metal film may be laminated in contact with a face of the first metal film that is located on the other side of the semiconductor substrate. In this case, the first metal film may be a metal film that contains 10 or more mass % of Al as a main component, and the second metal film may be a metal film that contains 10 or more mass % of at least one substance selected from a group of Ni, Ti, Mo, W, Ag, Cu and Zn as a main component. Furthermore, it is preferable that the first metal film (the metal film that contains 10 or more mass % of Al as a main component) have a thickness equal to or larger than 1 µm. In the case where the second metal film is a metal film that contains 10 or more mass % of Ni as a main component, it is preferable that the second metal film have a thickness equal to or larger than 500 nm.

Besides, the first metal film may be a metal film that contains 10 or more mass % of Ni as a main component, and the second metal film may be a metal film that contains 10 or more mass % of at least one substance selected from a group of Zn and Ti. In this case, the first metal film (the metal film that contains 10 or more mass % of Ni as a main component) may have a thickness equal to or larger than 500 nm.

The semiconductor device may further be equipped with: a main electrode that is formed in an element formation field of the semiconductor substrate. In this case, the first metal film, the second metal film, and the detection terminal may be electrically independent of the main electrode. Besides, the first metal film, the second metal film, and the detection terminal may be connected to a current path of the main electrode. Alternatively, the composite metal film may be at least part of a main electrode that is formed in an element formation field of the semiconductor substrate.

Besides, the present specification discloses a method of manufacturing the aforementioned semiconductor device. In the method of manufacturing the aforementioned semiconductor device, it is preferable that the first metal film and the second metal film be continuously deposited in a vacuum through sputtering. Besides, it is preferable that the first metal film and the second metal film be deposited through sputtering through the use of a deposition target with a purity equal to or higher than 99%, under a condition that a standby degree of vacuum of a sputtering chamber be equal to or lower than $1\times10^{-6}$ Pa, that a pressure fluctuation in the chamber during deposition be equal to or lower than 10%, and that a deposition gas purity be equal to or higher than 99%.

MODES FOR CARRYING OUT THE INVENTION

A semiconductor device disclosed by the present specification is equipped with a semiconductor substrate, and a composite metal film that is formed on a surface or a back face of the semiconductor substrate. The composite metal film is equipped with a first metal film and a second metal film, and the first metal film and the second metal film are joined to each other. The first metal film and the second metal film are different in Seebeck coefficient from each other. The semiconductor device disclosed by the present specification is further equipped with a detection terminal that can detect a potential difference between the first metal film and the second metal film. A joint face of the first metal film and the second metal film is a temperature measurement contact point, and the detection terminal is a reference contact point. A thermoelectromotive force that is generated in accordance with a temperature difference between the temperature measurement contact point and the reference contact point can be measured by the detection terminal. Thus, the temperature of the semiconductor device can be detected.

By utilizing, as a temperature detection element, the composite metal film that is obtained by joining the first metal film and the second metal film, which are different in Seebeck coefficient from each other, to each other, the temperature detection element that is excellent in responsiveness in detecting a temperature and can detect the temperature with high accuracy can be provided. In the temperature detection element that employs the composite metal film, a thermoelectromotive force that is generated in accordance with a temperature difference between the temperature measurement contact point and the reference contact point is measured. Thus, for example, in the case where the rate of rise in thermoelectromotive force per temperature is 3 mV/° C., a change in thermoelectromotive force can be measured through the use of a potential detector (e.g., a voltmeter) whose measurement range is set in the mV order. Since even a minor change in temperature can be measured in a relatively good condition, good measurement accuracy is obtained. Furthermore, in the temperature detection element that employs the composite metal film, the thermoelectromotive force is unsusceptible to the influence of the shape or size of the composite metal film. Therefore, the dispersion of characteristics at the time of manufacture can be reduced. Incidentally, in order to detect a potential difference between the first metal film and the second metal film through the use of the detection terminal, a conventionally known potential detector (e.g., a voltmeter or the like) can be utilized. For example, a first detection terminal that is electrically connected to the first metal film and a second detection terminal that is electrically connected to the second metal film are each connected to the potential detector, and a potential difference between the first detection terminal and the second detection terminal is measured, whereby a potential difference between the first metal film and the second metal film can be detected.

The semiconductor element that is formed on the semiconductor substrate is not limited in particular. However, for example, it is possible to exemplify a diode, a MOSFET, an IGBT, an RC-IGBT with a diode and an IGBT formed on the same semiconductor substrate, and the like. The temperature detection element that employs the composite metal film can be favorably utilized for a semiconductor device (e.g., a power semiconductor device) on which a semiconductor element, which generates a large amount of heat during driving and through which a large current flows, is formed.

In the aforementioned semiconductor device, the composite metal film may be formed on either the surface or the back face of the semiconductor substrate. Besides, the composite metal film may be in contact with the semiconductor substrate, or another film such as an insulating film or the like may be interposed between the composite metal film and the semiconductor substrate. Incidentally, "the composite metal film that is formed on the surface or the back face of the semiconductor substrate" as mentioned in the present specification includes both a composite metal film that is formed in contact with a semiconductor substrate, and a composite metal film that is formed between semiconductor substrates via another film such as an insulating film or the like. The conventional temperature detection element that employs the PN diode needs to be used while being insulated from the semiconductor substrate, and cannot be directly formed on the surface of the semiconductor substrate. In contrast, the temperature detection element that employs the composite metal film disclosed by the present specification may be electrically connected to the semiconductor substrate, or may be in contact with the surface of the semiconductor substrate. In the conventional temperature detection element that employs the PN diode, the locations of installation in the semiconductor device are restricted, and a sufficient space for installing the temperature detection element needs to be secured. The temperature detection element that employs the composite metal film disclosed by the present specification drastically eases the restrictions on the installation space in comparison with conventional cases, and can contribute toward reducing the size of the semiconductor device.

It is sufficient that the first metal film and the second metal film be joined to each other. For example, the first metal film and the second metal film may be laminated on each other in a depth direction of the semiconductor substrate. The first metal film and the second metal film may be adjacent to each other in a plane direction of the semiconductor substrate (a direction perpendicular to the depth direction). Alternatively, the first metal film and the second metal film may be joined to each other in a composite form consisting of these forms. It is sufficient that the detection terminal can measure a thermoelectromotive force of the first metal film and the second metal film. For example, the first detection terminal that is electrically connected to the first metal film, and the second detection terminal that is electrically connected to the second metal film may be provided. Although not limited in particular, as concrete examples of the detection terminals, it is possible to exemplify a wiring, a wiring pullout structure, and a pad structure (an electrode pad or the like). A case where each of the detection terminals is made of the same material as a corresponding one of the metal films connected thereto is preferable because the detection terminals are easy to design. In the case where high priority is given to material costs, a material that is different from that of each of the metal films connected to a corresponding one of the detection terminals can also be used as the corresponding one of the detection terminals. In this case, the temperature detection element can be utilized by being designed in consideration of a thermoelectromotive force of joint regions of the first and second metal films and the detection terminals. Only a single composite metal film may be formed on the semiconductor device, or a plurality of composite metal films may be formed on the semiconductor device. In the case where the plurality of the composite metal films are formed, it is preferable that each of the composite metal films be provided with a corresponding one of separate detection terminals that are electrically independent of one another.

The composite metal film may be a composite metal film that is laminated in the depth direction of the semiconductor device. The first metal film may be in contact with the surface or the back face of the semiconductor substrate, and the second metal film may be formed further in contact with a surface or a back face of the first metal film (a surface thereof that is located on the other side of the semiconductor substrate). In this case, it is preferable that the difference between the Seebeck coefficient of the material of the first metal film and the Seebeck coefficient of the material of the second metal film be large, and that these metal materials be used as electrodes of a semiconductor device. Specifically, it is preferable that the first metal film be a metal film that contains 10 or more mass % of Al as a main component, and that the second metal film be a metal film that contains 10 or more mass % of at least one substance selected from a group of Ni, Ti, Mo, W, Ag, Cu and Zn. It is more preferable that the second metal film be a metal film that contains 10 or more mass % of Ni as a main component. Furthermore, it is preferable that the first metal film (a metal film that contains 10 or more mass % of Al as a main component) have a thickness equal to or larger than 1 μm. In the case where the second metal film is a metal film that contains 10 or more mass % of Ni as a main component, it is preferable that the second metal film have a thickness equal to or larger than 500 nm.

Besides, the first metal film may be a metal film that contains 10 or more mass % of Ni as a main component, and the second metal film may be a metal film that contains 10 or more mass % of at least one substance selected from a group of Zn and Ti as a main component. In this case, it is preferable that the first metal film (a metal film that contains 10 or more mass % of Ni as a main component) have a thickness equal to or larger than 500 nm.

The composite metal film that has the first metal film and the second metal film, which have the aforementioned composition, can be favorably utilized as a main electrode of the semiconductor device (an electrode that is connected to a semiconductor element). Even in the case where the composite metal film is not utilized as the main electrode, there is an advantage that the composite metal film can be simultaneously manufactured in the same manufacturing process as the main electrode. In the case where the components of the composite metal film, the main electrode, and the detection terminals are identical, both the composite metal film and the main electrode can be simultaneously manufactured in a common process. Therefore, the process of manufacturing can be simplified.

The semiconductor device may further be equipped with a main electrode that is formed in an element formation field of the semiconductor substrate. In this case, the first metal film, the second metal film, and the detection terminals may be electrically independent of the main electrode. Besides, the first metal film, the second metal film, and the detection terminals may be connected to a current path of the main electrode. Alternatively, the composite metal film may be at least part of the main electrode that is formed in the element formation field of the semiconductor substrate.

For example, in the case where an IGBT element is formed on the semiconductor substrate, it is preferable that the composite metal film be common to a current path between an emitter electrode and a collector electrode. Specifically, for example, it is preferable that the composite metal film be installed as part of a wiring through which a current flows. Furthermore, it is more preferable that the composite metal film be formed in a field of the semiconductor substrate in which an IGBT element is formed. The space for installing the composite metal film that is utilized as a temperature detection element can be omitted, and the temperature detection sensitivity can be enhanced. In the case where the composite metal film is common to the current path between the emitter electrode and the collector electrode, it is preferable that the emitter terminal be electrically independent of other terminals (the collector terminal, a gate terminal and the like). Specifically, for example, a semiconductor device having a cluster IGBT structure in which an emitter contact portion is covered with a floating diffusion layer and an emitter terminal is electrically independent of other terminals is preferable.

It is preferable that the first metal film and the second metal film be manufactured by being continuously deposited in a vacuum through sputtering. The second metal film is manufactured without being exposed to the atmosphere after the first metal film is manufactured, whereby the concentration of impurities on the joint face of the first metal film and the second metal film can be restrained from increasing. Thus, the joint face can be homogenized, and the temperature detection element having good characteristics can be formed. It is more preferable that the first metal film and the second metal film be manufactured by being deposited through sputtering under a condition that a standby degree of vacuum of a sputtering chamber be equal to or lower than $1\times10^{-6}$ Pa, that a pressure fluctuation in the chamber during deposition be equal to or lower than 10%, that a purity of a deposition gas (e.g., argon gas, krypton gas) be equal to or higher than 99%, and that a deposition target purity be equal to or higher than 99%. It should be noted herein that the deposition target purity being equal to or higher than 99% means that the composition components of the first metal film and the second metal film account for 99% or more, and that the rest are inevitable impurities. Incidentally, the method of forming the first metal film and the second metal film is not limited to a method of deposition through sputtering. For example, a conventionally known method of depositing a metal film, such as a plating method or the like, can be utilized. In the case where the plating method is used, the compositions of the first metal film and the second metal film need to be strictly regulated. In the case of deposition through sputtering, the compositions of the first metal film and the second metal film are relatively easy to regulate.

First Embodiment

Semiconductor Device

Figure 1:
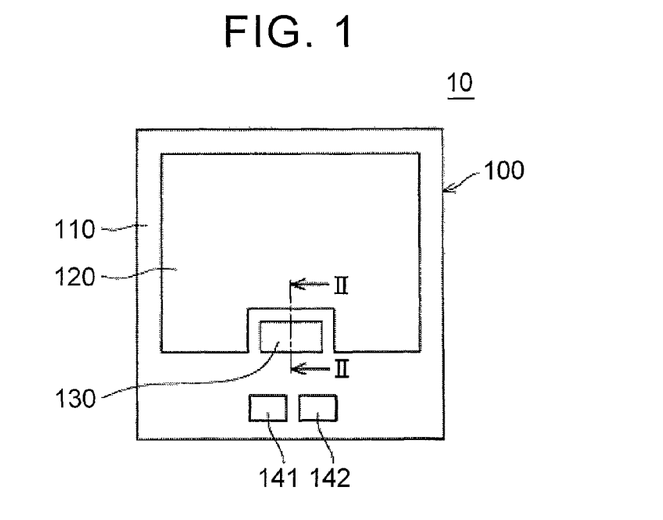
FIG. 1 is a plan view of a semiconductor device according to a first embodiment of the invention.
Figure 2:
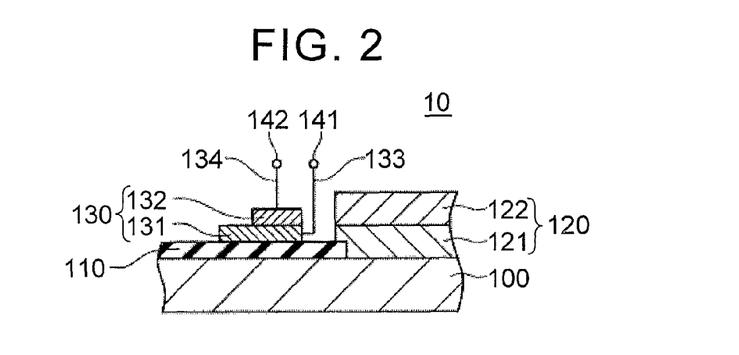
FIG. 2 is a cross-sectional view taken along a line II-II of FIG. 1.

As shown in FIGS. 1 and 2, a semiconductor device 10 according to the first embodiment of the invention is equipped with a semiconductor substrate 100, a surface insulating film 110, a main electrode 120, a composite metal film 130, and electrode pads 141 and 142.

Although not shown in the drawings, an IGBT as a semiconductor element is formed on the semiconductor substrate 100. The surface insulating film 110 is in contact with a surface of the semiconductor substrate 100 in a field in which no IGBT element is formed. The composite metal film 130 is in contact with a surface of the surface insulating film 110. The main electrode 120 is in contact with the surface of the semiconductor substrate 100 in a field in which an IGBT element is formed. The main electrode 120 is an emitter electrode. Incidentally, although not shown in the drawings, a collector electrode is formed in contact with a back face of the semiconductor substrate 100. The main electrode 120 has a first electrode film 121 and a second electrode film 122 that are laminated on each other in a depth direction of the semiconductor substrate 100. The first electrode film 121 is in contact with the surface of the semiconductor substrate 100. The second electrode film 122 is in contact with a surface of the first electrode film 121. The first electrode film 121 and the second electrode film 122 are joined to each other. The first electrode film 121 is a metal film that contains 10 or more mass % of Al as a main component. The second electrode film 122 is a metal film that contains 10 or more mass % of Ni as a main component.

The composite metal film 130 has a first metal film 131 and a second metal film 132 that are laminated on each other in the depth direction of the semiconductor substrate 100. The first metal film 131 is in contact with the surface of the surface insulating film 110. The second metal film 132 is in contact with a surface of the first metal film 131. The first metal film 131 and the second metal film 132 are joined to each other. The first metal film 131 is a metal film that contains 10 or more mass % of al as a main component, and has a thickness equal to or larger than 1 μm. The second metal film 132 is a metal film that contains 10 or more mass % of Ni as a main component, and has a thickness equal to or larger than 500 nm. A Seebeck coefficient S1 of the first metal film 131 and a Seebeck coefficient S2 of the second metal film 132 are different from each other (S1≠S2). The first metal film 131 is connected to the electrode pad 141 by a wiring 133, and the second metal film 132 is connected to the electrode pad 142 by a wiring 134. The wiring 133 and the electrode pad 141 are a first detection terminal, and are formed of the same material as the first metal film 131. The wiring 134 and the electrode pad 142 are a second detection terminal, and are formed of the same material as the second metal film 132.

The electrode pads 141 and 142 are connected to a potential detector (not shown) such as a voltmeter or the like, whereby a potential difference between the first metal film 131 and the second metal film 132 can be detected. Since the Seebeck coefficient S1 of the first metal film 131 and the Seebeck coefficient S2 of the second metal film 132 are different from each other, a potential difference is generated due to a temperature difference between the joint face of the first metal film 131 and the second metal film 132 and the electrode pads 141 and 142. By detecting this potential difference through the use of the potential detector, a temperature of the semiconductor device 10 can be detected. The composite metal film 130 that has the first metal film 131 and the second metal film 132, the electrode pads 141 and 142, and the wirings 133 and 134 can be utilized as a temperature detection element of the semiconductor device 10.

(Method of Manufacturing Semiconductor Device)

In the semiconductor device 10, the first metal film 131 and the second metal film 132 are formed by being continuously deposited in a vacuum through sputtering. For example, after the semiconductor substrate is arranged in the sputtering chamber, the standby degree of vacuum of the chamber is set equal to or lower than $1 \times 10^{-6}$ Pa, and deposition is carried out through sputtering tinder the condition that the pressure fluctuation in the chamber during deposition be equal to or lower than 10% and that the deposition gas purity be equal to or higher than 99%, using the deposition target that is made of the same material as the first metal film 131 (a target in which the composition component of the first metal film 131 accounts for 99 or more %). Subsequently, deposition is carried through sputtering under the condition that the pressure fluctuation in the chamber during deposition be equal to or lower than 10% and that the deposition gas purity be equal to or higher than 99%, using the deposition target that is made of the same material as the second metal film 132 (a target in which the composition component of the second metal film 132 accounts for 99 or more %). Thus, the joint face of the first metal film 131 and the second metal film 132 can be held in a good condition. Incidentally, in the case where the first metal film 131 and the first electrode film 121 are made of the same material, deposition can be simultaneously carried out. By the same token, in the case where the second metal film 132 and the second electrode film 122 are made of the same material, deposition can be simultaneously carried out.

Modification Examples

Figure 3:
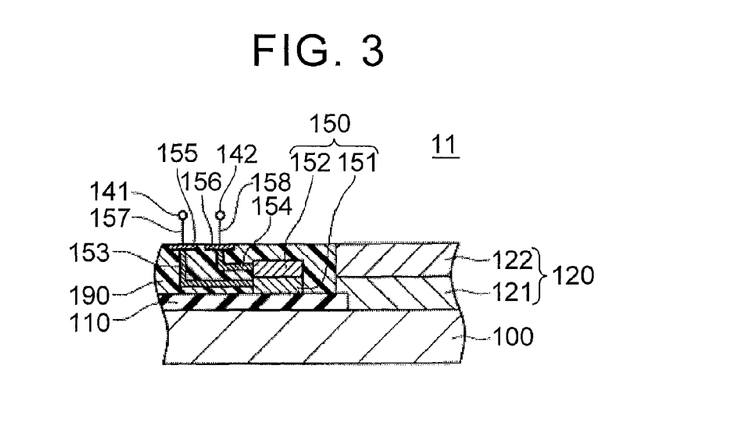
FIG. 3 is a cross-sectional view of a semiconductor device according to a modification example.
Figure 4:
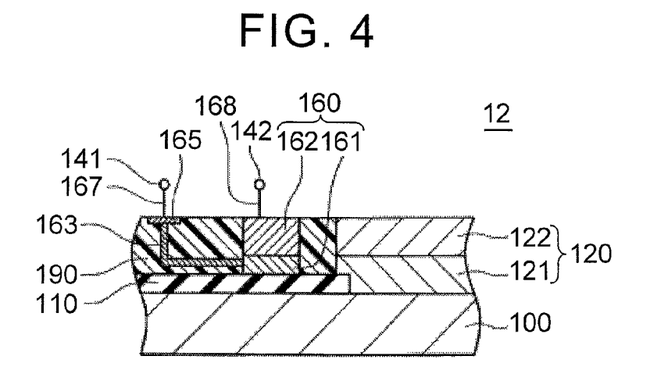
FIG. 4 is a cross-sectional view of a semiconductor device according to another modification example.
Figure 5:
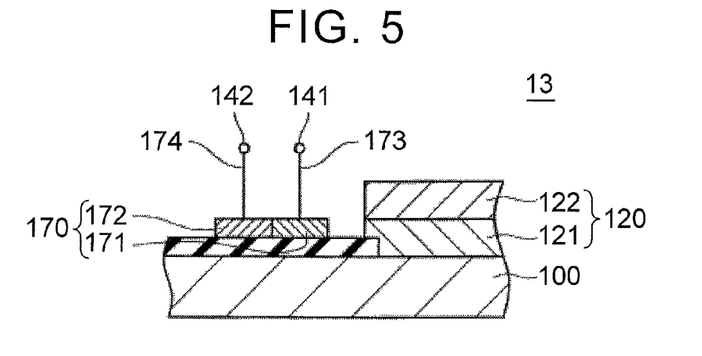
FIG. 5 is a cross-sectional view of a semiconductor device according to still another modification example.

FIGS. 3 to 5 show modification examples of the semiconductor device 10 shown in FIGS. 1 and 2. A semiconductor device 11 shown in FIG. 3 is equipped with a composite metal film 150 that is formed on the surface of the semiconductor substrate 100 via the surface insulating film 110. The composite metal film 150 has a first metal film 151 and a second metal film 152 that are laminated on each other in the depth direction of the semiconductor substrate 100. The first metal film 151 is in contact with the surface of the surface insulating film 110. The second metal film 152 is in contact with a surface of the first metal film 151. The first metal film 151 and the second metal film 152 are joined to each other.

The first metal film 151 is connected to a connection pad 155 by a wiring pullout structure 153, and the second metal film 152 is connected to a connection pad 156 by a wiring pullout structure 154. The first metal film 151, the second metal film 152 and the wiring pullout structures 153 and 154 are covered with a protection film 190 that is made of a material such as polyimide or the like. Surfaces of the connection pads 155 and 156 are exposed to a surface of the protection film 190. The connection pad 155 is connected to the electrode pad 141 by a wiring 157, and the connection pad 156 is connected to the electrode pad 142 by a wiring 158. The wiring pullout structure 153, the connection pad 155, the wiring 157, and the electrode pad 141 are the first detection terminal, and are formed of the same material as the first metal film 151. The wiring pullout structure 154, the connection pad 156, the wiring 158, and the electrode pad 142 are the second detection terminal, and are formed of the same material as the first metal film 151.

Besides, a semiconductor device 12 shown in FIG. 4 is equipped with a composite metal film 160 that is formed on the surface of the semiconductor substrate 100 via the surface insulating film 110. The composite metal film 160 has a first metal film 161 and a second metal film 162 that are laminated on each other in the depth direction of the semiconductor substrate 100. The first metal film 161 is in contact with the surface of the surface insulating film 110. The second metal film 162 is in contact with a surface of the first metal film 161. The first metal film 161 and the second metal film 162 are joined to each other.

The first metal film 161 is connected to a connection pad 165 by a wiring pullout structure 163. The first metal film 161 and the wiring pullout structure 163 are covered with the protection film 190 that is made of a material such as polyimide or the like. Surfaces of the connection pad 165 and the second metal film 162 are exposed to the surface of the protection film 190. The connection pad 165 is connected to the electrode pad 141 by a wiring 167, and the second metal film 162 is connected to the electrode pad 142 by a wiring 168. The wiring pullout structure 163, the connection pad 165, the wiring 167, and the electrode pad 141 are the first detection terminal, and are formed of the same material as the first metal film 161. The wiring 168 and the electrode pad 142 are the second detection terminal, and are formed of the same material as the second metal film 162.

Besides, a semiconductor device 13 shown in FIG. 5 is equipped with a composite metal film 170 that is formed on the surface of the semiconductor substrate 100 via the surface insulating film 110. The composite metal film 170 has a first metal film 171 and a second metal film 172 that are adjacent to each other in a plane direction (a direction perpendicular to the depth direction) of the semiconductor substrate 100. The first metal film 171 and the second metal film 172 are in contact with the surface of the surface insulating film 110. The first metal film 171 and the second metal film 172 are joined, on lateral faces thereof, to each other.

The first metal film 171 is connected to the electrode pad 141 by a wiring 173, and the second metal film 172 is connected to the electrode pad 142 by a wiring 174. The wiring 173 and the electrode pad 141 are the first detection terminal, and are formed of the same material as the first metal film 171. The wiring 174 and the electrode pad 142 are the second detection terminal, and are formed of the same material as the second metal film 172. As shown in FIG. 5, in the case where the first metal film 171 and the second metal film 172 are adjacent to each other in the plane direction (the direction perpendicular to the depth direction) of the semiconductor substrate, the wirings of the detection terminals are easy to route. In the case where a composite metal film is formed on a back face side of a semiconductor substrate with a relatively low degree of freedom in routing wirings, it is preferable to adopt a composite metal film in which a first metal film and a second metal film are adjacent to each other in a plane direction of the semiconductor substrate.

Each of the first metal films 151, 161 and 171 is a metal film that contains 10 or more mass % of Al as a main component, and has a thickness equal to or larger than 1 µm. Each of the second metal films 152, 162 and 172 is a metal film that contains 10 or more mass % of Ni as a main component, and has a thickness equal to or larger than 500 mm. Each of the first metal films 151, 161 and 171 is different in Seebeck coefficient from a corresponding one of the second metal films 152, 162 and 172. Incidentally, since the semiconductor devices 11, 12 and 13 are identical in other configurational details to the semiconductor device 10, redundant description will be omitted.

In each of the semiconductor devices 11, 12 and 13 as well, a potential detector is connected etc. to the electrode pads 141 and 142; whereby a potential difference between the first metal film (151, 161, 171) and the second metal film (152, 162, 172) can be detected. The composite metal film (150, 160, 170), the wiring pullout structure (153, 154, 163) connected thereto, the connection pad (155, 156, 165), the wirings (157, 158, 167, 168, 173, 174), the electrode pads (141, 142) and the like can be utilized as the temperature detection element of the semiconductor device (11, 12, 13).

Second Embodiment

Semiconductor Device

Figure 6:
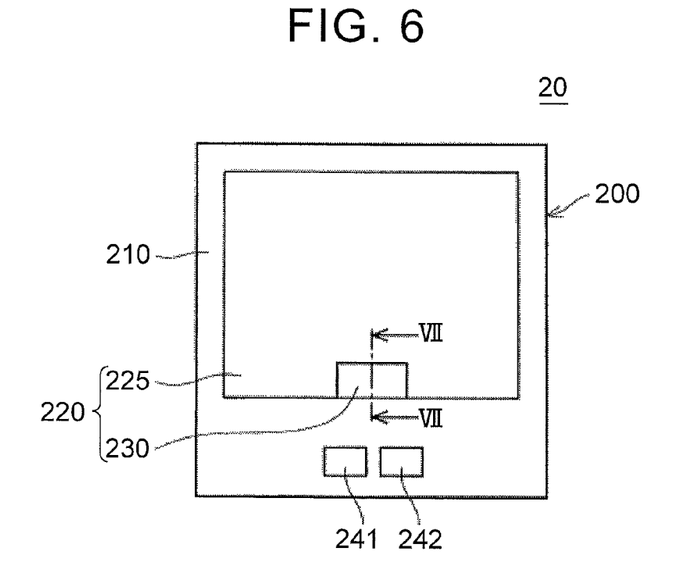
FIG. 6 is a plan view of a semiconductor device according to a second embodiment of the invention.
Figure 7:
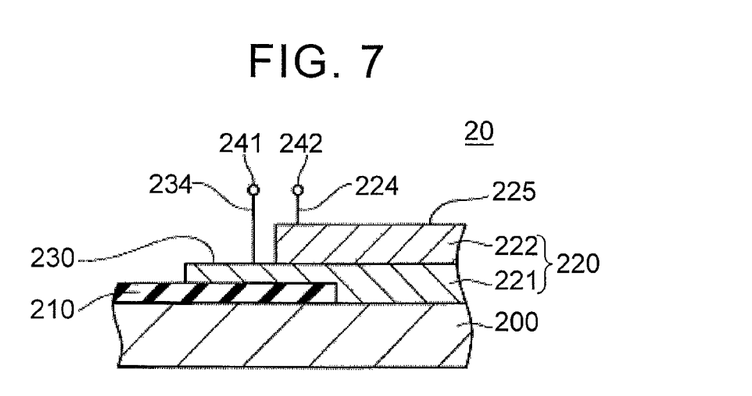
FIG. 7 is a cross-sectional view taken along a line VII-VII of FIG. 6.

As shown in FIGS. 6 and 7, a semiconductor device 20 according to the second embodiment of the invention is equipped with a semiconductor substrate 200, a surface insulating film 210, a composite metal film 220, and electrode pads 241 and 242. The composite metal film 220 is equipped with a main portion 225 and a detection portion 230. Although not shown in the drawings, an IGBT as a semiconductor element is formed on the semiconductor substrate 200. The main portion 225 is in contact with a surface of the semiconductor substrate 200 in a field in which an IGBT element is formed. The surface insulating film 210 is in contact with the surface of the semiconductor substrate 200 in a field in which no IGBT element is formed. The detection portion 230 is in contact with a surface of the surface insulating film 210. The main portion 225 functions as an emitter electrode. Incidentally, although not shown in the drawings, a collector electrode is formed in contact with a back face of the semiconductor substrate 200.

The composite metal film 220 has a first metal film 221 and a second metal film 222 that are laminated on each other in a depth direction of the semiconductor substrate 200. The first metal film 221 is in contact with the surface of the semiconductor substrate 200. The second metal film 222 is in contact with a surface of the first metal film 221. The first metal film 221 and the second metal film 222 are joined to each other. The first metal film 221 is a metal film that contains 10 or more mass % of Al as a main component, and has a thickness equal to or larger than 1 µm. The second metal film 222 is a metal film that contains 10 or more mass % of Ni as a main component, and has a thickness equal to or larger than 500 nm. A Seebeck coefficient S21 of the first metal film 221 and a Seebeck coefficient S22 of the second metal film 222 are different from each other (S2≠S22). A wiring 234 is connected to a surface of the detection portion 230 of the first metal film 221. The wiring 234 is connected to the electrode pad 241. A wiring 224 is connected to a surface of the second metal film 222. The wiring 224 is connected to the electrode pad 242. The wiring 234 and the electrode pad 241 are the first detection terminal, and are formed of the same material as the first metal film 221. The wiring 224 and the electrode pad 242 are the second detection terminal, and are formed of the same material as the second metal film 222.

The electrode pads 241 and 242 are connected to a potential detector (not shown), whereby a potential difference between the first metal film 221 and the second metal film 222 can be detected. Since the Seebeck coefficient S21 of the first metal film 221 and the Seebeck coefficient S22 of the second metal film 222 are different from each other (S21≠S22), a potential difference is generated due to a temperature difference between a joint face of the first metal film 221 and the second metal film 222 and the electrode pads 241 and 242. This potential difference is detected by the potential detector, whereby a temperature of the semiconductor device 20 can be detected. The composite metal film 220 that has the first metal film 221 and the second metal film 222, the electrode pads 241 and 242, and the wirings 224 and 234 can be utilized as a temperature detection element of the semiconductor device 20. Besides, the composite metal film 220 can also be utilized as an emitter electrode of an IGBT. A current path during detection of a temperature and a current path of the IGBT are common. Therefore, a space for installing the composite metal film 220 that is utilized as the temperature detection element can be omitted, and the temperature detection sensitivity can be enhanced. Incidentally, the first metal film 221 and the second metal film 222 can be manufactured according to a manufacturing method similar to that described in the first embodiment of the invention.

Modification Examples

Figure 8:
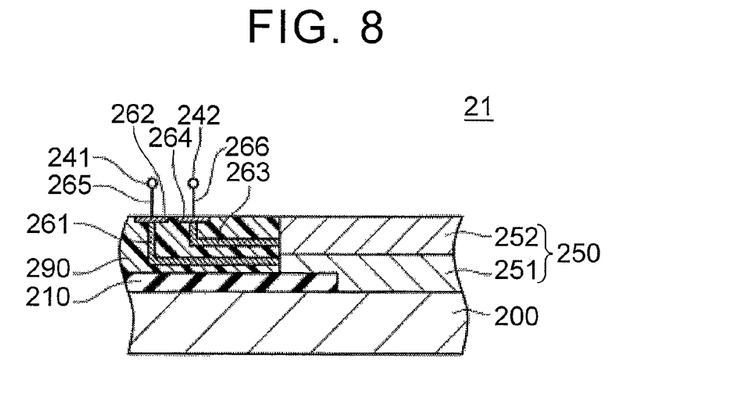
FIG. 8 is a cross-sectional view of a semiconductor device according to a modification example.
Figure 9:
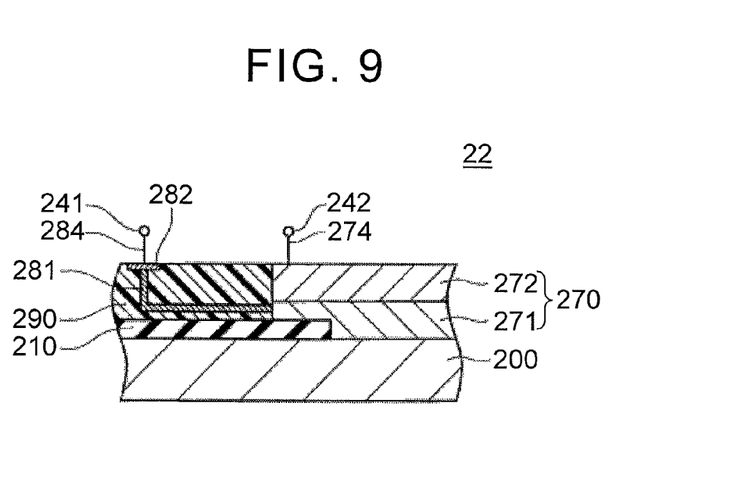
FIG. 9 is a cross-sectional view of a semiconductor device according to another modification example.

FIGS. 8 and 9 show modification examples of the semiconductor device 20 shown in FIGS. 6 and 7. A semiconductor device 21 shown in FIG. 8 is equipped with a composite metal film 250 that is formed in contact with the surface of the semiconductor substrate 200 in a field in which an IGBT element is formed. The composite metal film 250 has a first metal film 251 and a second metal film 252 that are laminated on each other in a depth direction of the semiconductor substrate 200. The first metal film 251 is in contact with the surface of the semiconductor substrate 200 in the field in which the IGBT element is formed. The second metal film 252 is in contact with a surface of the first metal film 251. The first metal film 251 and the second metal film 252 are joined to each other.

The first metal film 251 is connected to a connection pad 262 by a wiring routing structure 261, and the second metal film 252 is connected to a connection pad 264 by a wiring routing structure 263. The first metal film 251 is covered with the second metal film 252 and a protection film 290 that is made of a material such as polyimide or the like. The wiring routing structures 261 and 263 are covered with the protection film 290. Surfaces of the second metal film 252 and the connection pads 262 and 264 are exposed to a surface of the protection film 290. The connection pad 262 is connected to the electrode pad 241 by a wiring 265, and the connection pad 264 is connected to the electrode pad 242 by a wiring 266. The wiring routing structure 261, the connection pad 262, the wiring 265 and the electrode pad 241 are the first detection terminal, and are formed of the same material as the first metal film 251. The wiring routing structure 263, the connection pad 264, the wiring 266 and the electrode pad 242 are the second detection terminal, and are formed of the same material as the second metal film 252.

Besides, a semiconductor device 22 shown in FIG. 9 is equipped with a composite metal film 270 that is formed in contact with the surface of the semiconductor substrate 200 in a field in which an IGBT element is formed. The composite metal film 270 has a first metal film 271 and a second metal film 272 that are laminated on each other in a depth direction of the semiconductor substrate 200. The first metal film 271 is in contact with the surface of the semiconductor substrate 200 in the field in which the IGBT element is formed. The second metal film 272 is in contact with a surface of the first metal film 271. The first metal film 271 and the second metal film 272 are joined to each other.

The first metal film 271 is connected to a connection pad 282 by a wiring routing structure 281. The first metal film 271 is covered with the second metal film 272 and the protection film 290 made of a material such as polyimide or the like. The wiring routing structure 281 is covered with the protection film 290. Surfaces of the connection pad 282 and the second metal film 272 are exposed to the surface of the protection film 290. The connection pad 282 is connected to the electrode pad 241 by a wiring 284, and the second metal film 272 is connected to the electrode pad 242 by a wiring 274. The wiring routing structure 281, the connection pad 282, the wiring 284 and the electrode pad 241 are the first detection terminal, and are formed of the same material as the first metal film 271. The wiring 274 and the electrode pad 242 are the second detection terminal, and are formed of the same material as the second metal film 272.

Each of the first metal films 251 and 271 is a metal film that contains 10 or more mass % of Al as a main component, and has a thickness equal to or larger than 1 μm. Each of the second metal films 252 and 272 is a metal film that contains 10 or more mass % of Ni as a main component, and has a thickness equal to or larger than 500 nm. Each of the first metal films 251 and 271 is different in Seebeck coefficient from a corresponding one of the second metal films 252 and 272. Incidentally, since the semiconductor devices 21 and 22 are identical in other configurational details to the semiconductor device 20, redundant description will be omitted.

In each of the semiconductor devices 21 and 22 as well, a potential detector is connected etc. to the electrode pads 241 and 242, whereby a potential difference between the first metal film (251, 271) and the second metal film (252, 272) can be detected. The composite metal film 250 and 270, the wiring routing structure (261, 263, 281) connected thereto, the connection pad (262, 264, 282), the wirings (265, 266, 274, 284), the electrode pads (241, 242) and the like can be utilized as the temperature detection element of the semiconductor device (21, 22). Besides, as is the case with the composite metal film 220, each of the composite metal films 250 and 270 can be utilized as an emitter electrode of an IGBT.

Although the embodiments of the invention have been described hereinabove in detail, these are nothing more than exemplifications, and are not intended to limit the claims. The art set forth in the claims encompasses various modifications and alterations of the concrete examples exemplified above.

The technical elements described in the present specification or the drawings exert technical usefulness alone or in various combinations, and should not be limited to the combinations set forth in the claims at the time of the filing of the application. Besides, the art exemplified in the present specification or the drawings can achieve a plurality of objects at the same time, and is technically useful through the achievement of one of those objects in itself.

What is claimed is:

1. A semiconductor device comprising:
   a semiconductor substrate;
   a main electrode, the main electrode including:
      a first metal film having a first face that is formed on a surface of an element formation field of the semiconductor substrate, and a second face that is located opposite to the first face, at least a part of the first metal film directly contacting the semiconductor substrate, and
      a second metal film that is joined directly to the second face of the first metal film and that is different in Seebeck coefficient from the first metal film; and
   a detection terminal that detects a potential difference between the first metal film and the second metal film; wherein
   a current of a main element formed in the element formation field of the semiconductor substrate and a current during detection of a temperature are the same, and
   the semiconductor device is configured such that the potential difference between the first and the second metal films is measured during operation of the main element.

2. The semiconductor device according to claim 1, wherein
   the detection terminal is equipped with a first detection terminal that is electrically connected to the first metal film, and a second detection terminal that is electrically connected to the second metal film,
   the first detection terminal is formed of a same material as the first metal film, and
   the second detection terminal is formed of a same material as the second metal film.

3. The semiconductor device according to claim 1, wherein
   the first metal film is a metal film that contains 10 or more mass % of Al as a main component, and
   the second metal film is a metal film that contains 10 or more mass % of at least one substance selected from a group of Ni, Ti, Mo, W, Ag, Cu and Zn as a main component.

4. The semiconductor device according to claim 3, wherein the first metal film has a thickness equal to or larger than 1 μm.

5. The semiconductor device according to claim 3, wherein
   the second metal film is a metal film that contains 10 or more mass % of Ni as a main component, and
   the second metal film has a thickness equal to or larger than 500 nm.

6. The semiconductor device according to claim 1, wherein
   the first metal film is a metal film that contains 10 or more mass % of Ni as a main component, and
   the second metal film is a metal film that contains 10 or more mass % of at least one substance selected from a group of Zn and Ti.

7. The semiconductor device according to claim 6, wherein the first metal film has a thickness equal to or larger than 500 nm.

8. The semiconductor device according to claim 1, wherein the main element formed in the element formation field of the semiconductor substrate is selected from the group consisting of a diode, a metal-oxide-semiconductor field-effect transistor (MOFSET), and an insulated-gate bipolar transistor (IGBT).

9. The semiconductor device according to claim 1, further comprising a protection film encapsulating a wiring system.

10. The semiconductor device according to claim 1, further comprising a protection film encapsulating a wiring system, wherein a top surface of the protection film is coplanar to a top surface of the second metal film.

11. A method of manufacturing a semiconductor device that is equipped with:
    a semiconductor substrate;
    a main electrode, the main electrode including:
       a first metal film having a first face that is formed on a surface of an element formation field of the semiconductor substrate, and a second face that is located opposite to the first face, at least a part of the first metal film directly contacting the semiconductor substrate, and
       a second metal film that is joined directly to the second face of the first metal film and that is different in Seebeck coefficient from the first metal film; and
    a detection terminal that detects a potential difference between the first metal film and the second metal film, wherein
    a current of a main element formed in the element formation field of the semiconductor substrate and a current during detection of a temperature are the same, and
    the semiconductor device is configured such that the potential difference between the first and the second metal films is measured during operation of the main element; the method comprising:
       depositing the first metal film and the second metal film continuously in a vacuum through sputtering.

12. The method of manufacturing according to claim 11, wherein
    the first metal film and the second metal film are deposited through sputtering through use of a deposition target with a purity equal to or higher than 99%, under a condition that a standby degree of vacuum of a sputtering chamber be equal to or lower than $1 \times 10^{-6}$ Pa, that a pressure fluctuation in the chamber during deposition be equal to or lower than 10%, and that a deposition gas purity be equal to or higher than 99%.

13. The method of manufacturing according to claim 11, wherein the main element formed in the element formation field of the semiconductor substrate is selected from the group consisting of a diode, a metal-oxide-semiconductor field-effect transistor (MOFSET), and an insulated-gate bipolar transistor (IGBT).

14. The method of manufacturing according to claim 11, wherein the semiconductor device further comprises a protection film encapsulating a wiring system.

15. The method of manufacturing according to claim 11, wherein
    the semiconductor device further comprises a protection film encapsulating a wiring system, and
    a top surface of the protection film is coplanar to a top surface of the second metal film.

* * * * *